United States Patent [19]
Demsky et al.
[11] 3,770,521
[45] Nov. 6, 1973

[54] METHOD FOR DIFFUSING B OR P INTO S: SUBSTRATES

[75] Inventors: Herbert M. Demsky, Wappingers Falls; Wilbur H. Dexter, Hyde Park; Reginald F. Lever, Putnam Valley; Paul A. Melzer, Newburgh, all of N.Y.

[73] Assignee: International Business Machines Corporation, Armonk, N.Y.

[22] Filed: Apr. 14, 1971

[21] Appl. No.: 134,009

[52] U.S. Cl. .................. 148/189, 148/186, 148/187
[51] Int. Cl. ............................................ H01l 7/44
[58] Field of Search .................... 148/189, 186, 187

[56] References Cited

UNITED STATES PATENTS

| | | | |
|---|---|---|---|
| 2,802,760 | 8/1957 | Derick et al. | 148/189 |
| 3,477,887 | 11/1969 | Ehlenberger | 148/189 |
| 3,484,314 | 12/1969 | Bohne et al. | 148/188 |
| 3,442,725 | 5/1969 | Huffman et al. | 148/189 |

*Primary Examiner*—G. T. Ozaki
*Attorney*—Hanifin and Jancin and Daniel E. Igo

[57] ABSTRACT

A method is disclosed whereby a semiconductor silicon substrate wafer is diffused with a P or N type dopant or "impurity" in an open tube at a temperature of about 1050°C in the presence of at least a 50:1 ratio of water to dopant whereby the surface concentration of impurity is controlled below the solid solubility of the dopant in silicon.

2 Claims, 4 Drawing Figures

INVENTORS
HERBERT M. DEMSKY
WILBUR H. DEXTER
REGINALD F. LEVER
PAUL A. MELZER
BY
ATTORNEY

METHOD FOR DIFFUSING B OR P INTO S: SUBSTRATES

BACKGROUND OF THE INVENTION

In the manufacture of semiconductor devices, it is necessary to introduce certain impurities or dopants into semiconductor material in order to form P-N junctions. The prior art has taught certain methods for accomplishing these diffusions. It has been the practice to expose the etched surface of semiconductor material at an elevated temperature to a vapor which includes the impurity to be diffused. In the formation of a P-type layer in an N-type silicon, $BBr_3$ and $B_2H_6$ materials have been introduced into a furnace in the presence of oxygen as the material containing the boron impurity to be diffused. Similarly, in the formation of an N-type layer in P-type silicon $PCl_3$, $POCl_3$ and $P_2O_5$ have been introduced into a furnace in the presence of oxygen as the material containing the phosphorus to be diffused.

It has been the practice to first predeposit the dopant upon the surface of a semiconductor at a first temperature level followed by a second and elevated temperature for actual diffusion. Likewise, where if various junction depths are desired, more than one diffusion operation is required. Another known method comprises the steps of forming an azeotropic mixture of the dopant and water, vaporizing the mixture and carrying it onto the semiconductor surface by means of a carrier gas and diffusing the dopant from said mixture into the semiconductor material.

Diffusion of impurities produces an impurity distribution in the semiconductive substrate material. This impurity distribution is related to other steps in the manufacture and fabrication and to ultimate component product. A uniform concentration during impurity diffusion into a body of semiconductor material is desirable and important in the creation of a plurality of devices in a single body material with other unitary circuit structures.

Other methods provide a method whereby a first semiconductor body is doped by heating in an evacuated system with another large body of semiconductor material containing the desired diffusion impurity. This method has proved difficult to carry out and control. Vacuum diffusion systems are carried out in quartz or similar material which are not capable of being reused for subsequent diffusions.

It has been proposed to dope semiconductor bodies with boron through the use of boron bromide and oxygen wherein boron and oxygen are introduced separately into a furnace containing semiconductor bodies. In such a method, a chemical reaction between the boron bromide and oxygen takes place within the furnace producing boron oxide ($B_2O_3$) and bromine. This reaction produces corrosive by-products and requires critical flow rates which contributes to non-uniform diffusions. A boron-rich borosilicate glass forms on the silicon wafer surface with a consequent heavy surface doping of the silicon. Also, undesirable boron oxide tends to form on the walls of the furnace causing additional process difficulties. The solid solubility limit ($6 \times 10^{20}$ atoms/$cm^3$) of boron in silicon is essentially the only concentration of boron in silicon attainable by this method. Variable concentration is practically unattainable.

Similarly, a boron-silicon phase which is not soluble in oxide etches is formed. This condition and high surface concentration ($C_o$) requires a further thermal oxidation or drive-in step following the diffusion if standard photoresist technology is to be applicable with lower surface concentrations of dopant. Likewise, special elevated temperature etches are required to remove said boron-silicon phase if an ultimate uniform diffusion is desired. Corrosive attack on the quartz tube is to such an extent in most cases as to make the reaction or diffusion tube non-reusable. Open tube diffusion of boron and phosphorus in silicon are normally accomplished and carried out at a relatively low temperature (900°–975°) and short cycle in order to avoid silicon pitting. Therefore, a subsequent drive-in step is required in a separate furnace if diffusion results comparable to the vacuum capsule are to be obtained.

SUMMARY OF THE INVENTION

It is an object of this invention to provide a method for open tube diffusions in silicon whereby variable concentrations of dopant are readily attainable.

A further object is a silicon diffusion method capable of producing uniform variable diffusion concentrations.

A still further object is to provide a silicon diffusion process whereby diffusion is carried out in an open tube at essentially atmospheric pressure.

Another object of the invention is to provide a method whereby subsequent post diffusion thermal oxidation or drive-in steps are unnecessary.

A still further objective of the invention is a method for the selective diffusion of boron or phosphorus in silicon in a manner whereby the diffused impurity concentration is variable from the solid solubility limit to lower decreased concentrations.

The foregoing and other objects as well as the operation of this invention will become more apparent upon consideration of the following detailed description and illustrated by the examples and the accompanying drawings where FIG. 1 is a diagrammatic representation of a typical conventional open tube diffusion apparatus.

Figure 1:
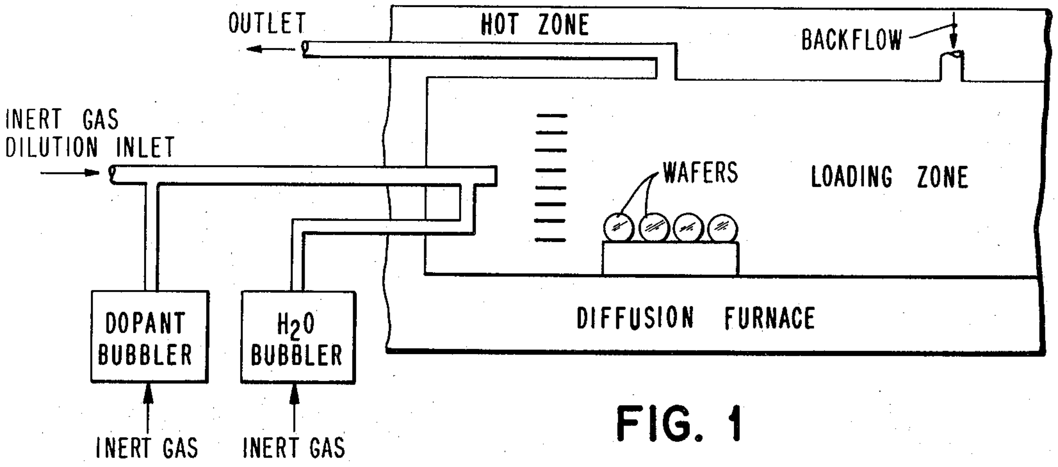

In general, this invention is especially suited to the formation of one or more P-N or N-P junctions in a semiconductive body for use in device applications and comprises diffusing an N or P impurity in silicon in accordance with the following steps:

a. heating a silicon substrate at atmospheric pressure to a temperature between 1000°–1100°C.

b. subjecting the heated silicon substrate to an ambient vapor flow of N or P type impurity and water for a period of from 50 to 130 minutes.

DETAILED DESCRIPTION

In a conventional open tube diffusion apparatus comprising a quartz tube in a suitable furnace capable of heating above 1200°C, clean silicon semiconductor wafers are inserted in the quartz tube and heated to a temperature of between 900°–1200°C in an ambient argon or similar inert gas atmosphere. (A diffusion temperature of about 1050°C is believed to be optimum). Upon reaching temperature equilibrium with furnace atmosphere, separate streams of boron tribromide or phosphorus oxytrichloride and water are injected into hot zone atmosphere surrounding the silicon wafer. The stream of water and $BBr_3$ dopant mix and react in the immediate hot zone atmosphere surrounding the silicon wafers. The resulting reaction is:

$$BBr_3 + 2H_2O = HBO_2 + 3HBr$$

The use of oxygen and an inert gas carrier produces the reaction:

$$4BBr_3 + 3O_2 = 2B_2O_3 + 6Br_2$$

The presence of $B_2O_3$ is undesirable because $B_2O_3$ tends to precipitate and coats the wafers and diffusion apparatus. The first reaction has the advantage of allowing to exist considerable partial pressures of $HBO_2$ without depositing $B_2O_3$ by the reaction $2HBO_2 = B_2O_3 + H_2O$. Partial pressure of $B_2O_3$ can be made considerably lower than the value in equilibrium with liquid $B_2O_3$, consequently, a more dilute borosilicate glass may be grown on the wafer surface. This obviates the necessity of a subsequent "drive-in" step. Similarly, by varying the boron tribromide-water ratio, one is capable of producing a wide range of oxidation rates and varying surface concentrations ($C_o$) which is believed to be dependent upon oxidation rates. This allows for a process flexiblity heretofore unknown.

In order to obtain the maximum advantage of the process, the dopant, for example $BBr_3$, and water must be admixed in the furnace hot zone because $BBr_3$ readily hydrolyzes to form undesirable $B_2O_3$ if mixture with water takes place, for example, at normal room atmospheric temperature.

It is now possible in accordance with this process to have a diffused surface concentration significantly below the solid solubility limit of boron in silicon by means of a $BBr_3$ deposition. Furthermore, the oxide formed during the deposition is totally soluble in HF and the thin insoluble interface layer of oxide formed with conventional $BBr_3$ depositions is not present.

The word dopant or "impurity" as used herein is intended to include materials which act as donors and acceptors in silicon substrate semiconductor wafers, for example, boron and phosphorus. The following specific examples are set forth, not in limitation of this invention, but in explanation and to further illustrate the applications and advantages thereof:

EXAMPLE I

Clean silicon wafers were placed in a conventional ladder boat contained in an open quartz diffusion tube in a muffle type electric furnace and heated in an argon atmosphere to 1050°C. Boron tribromide and water were separately introduced in the hot zone of the said diffusion tube at a flow rate of 55 cubic centimeters per minute at 1°C carried by a suitable flow of argon for the boron tribromide and a rate of 3350 cubic centimeters per minute at 23°C for water. Argon dilution flow for $BBr_3$ and $H_2O$ was 11,600 cubic centimeters per minute. This flow and temperature were maintained for a period of 120 minutes whereupon the flow of boron tribromide and water was discontinued and the tube purged with a continued five-minute flow of argon.

Silicon wafers were removed and found to have a 2000A. borosilicate glass film on the surface. Said film was insoluble in HF. Sheet resistivity was 8.5 ohms per square and the junction depth X was 0.056 mils. Impurity or dopant surface concentration, $C_o$, was $5.5 \times 10^{20}$ atoms per cubic centimeter.

EXAMPLE II

Similar conditions as set forth in Example I except that boron tribromide flow was reduced to 5 cubic centimeters per minute at 1°C. The silicon wafers had the following electrical properties:

Sheet resistivity —($P_s$) —1800 ohms per square
Diffusion depth —($X_i$) —0.029 mils
Surface concentration —($C_o$) — $1 \times 10^{18}$ atoms per cubic centimeter

EXAMPLE III

Similar conditions as delineated in Example I except boron tribromide flow was controlled at 30 cubic centimeters per minute at 1°C and the water flow maintained at 3350 cubic centimeters per minute at 23°C. The wafers processed in this manner exhibited the following electrical properties:

Sheet resistivity —($P_s$) — 90 ohms per square
Diffusion depth —($X_i$) — 0.048 mils
Surface concentration —($C_o$) — $4.5 \times 10^{19}$ atoms per cubic centimeter The film of borosilicate glass formed on the waters was about 700A. thick and soluble in HF.

EXAMPLE IV

Again, clean silicon wafers were placed in a conventional ladder boat contained in an open quartz diffusion tube in a muffle type electric furnace and heated in an argon atmosphere to 1050°C for approximately 5 minutes. Separately, phosphorus oxytrichloride ($POCl_3$) was fed into the wafer hot zone area at a rate of 16 cubic centimeters per minute accompanied by argon dilution of about 4600 cubic centimeters per minute. Water was separately bled into the hot zone area at about 40 cubic centimeters per minute. This flow was maintained for 60 minutes, followed by a 5-minute argon flush or vent flow at about 4400 cubic centimeters per minute. The wafers possessed the following electrical properties:

Sheet resistivity — ($P_s$) — 300 ohms per square
Diffusion depth — ($X_i$) — 0.025 mils
Surface concentration — ($C_o$) — $8 \times 10^{18}$ atoms per cubic centimeter It is apparent from the foregoing examples that the water to dopant or impurity ratio is in the magnitude of from 50:1 to 500:1.

The disclosed process possesses the significant advantage being able to produce, in essentially one step, a doped silicon substrate wafer having a surface concentration of dopant below the solid solubility limit of the impurity in the silicon. This obviates the necessity of carrying out subsequent "drive-in" or oxidation steps.

Figure 2:
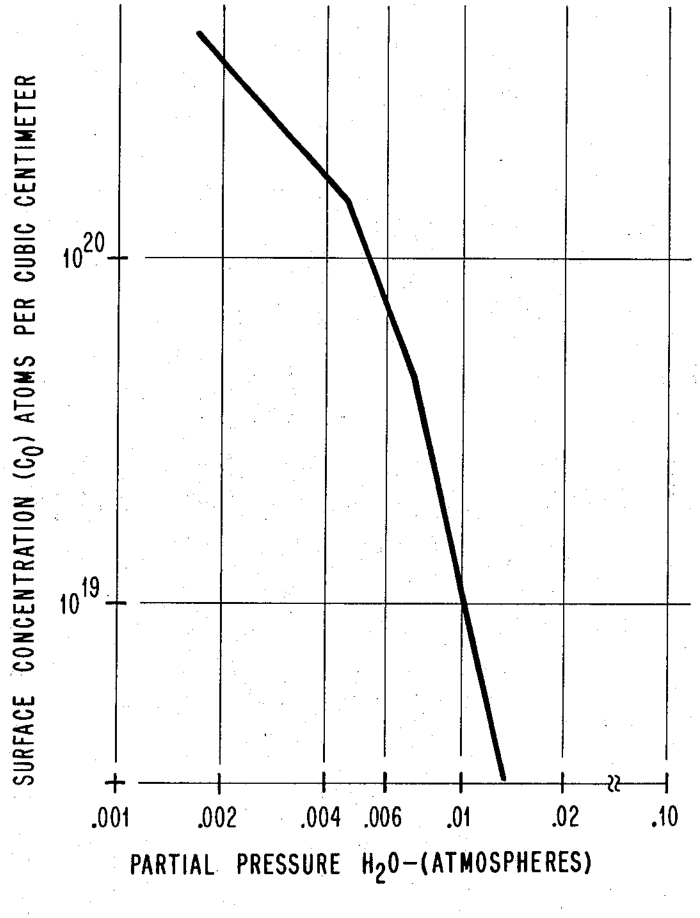
FIG. 2 is a graphic representation showing the surface concentration of "impurity" or dopant ($C_o$) in atoms per cubic centimeter versus partial pressure of process water in atmospheres in accordance with disclosed process.
Figure 3:
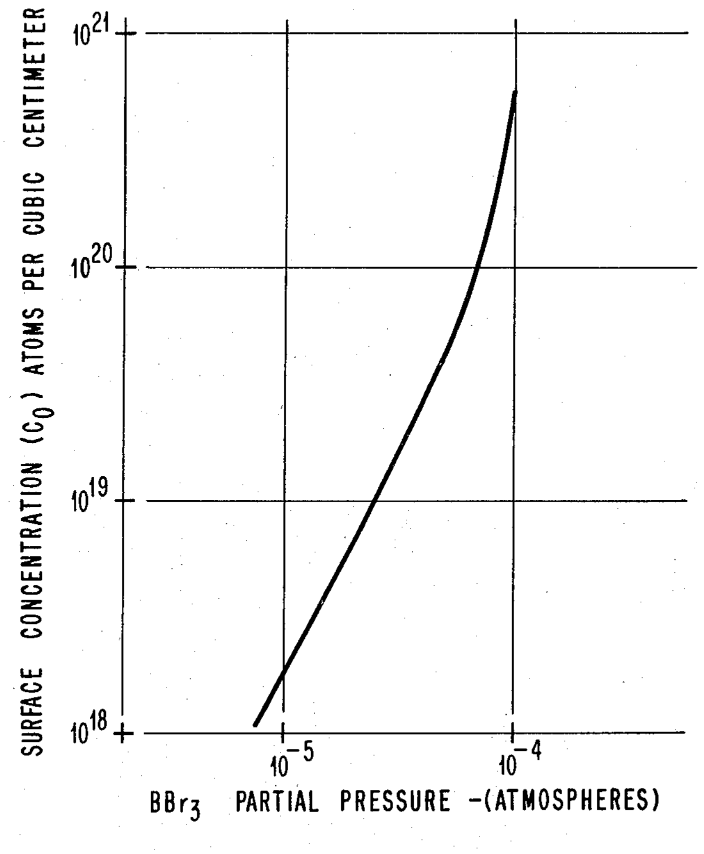
FIG. 3 is a graphic illustration of surface concentration of "impurity" or dopant ($C_o$) in atoms per cubic centimeter in a silicon wafer versus partial pressure of dopant (boron tribromide — $BBr_3$).
Figure 4:
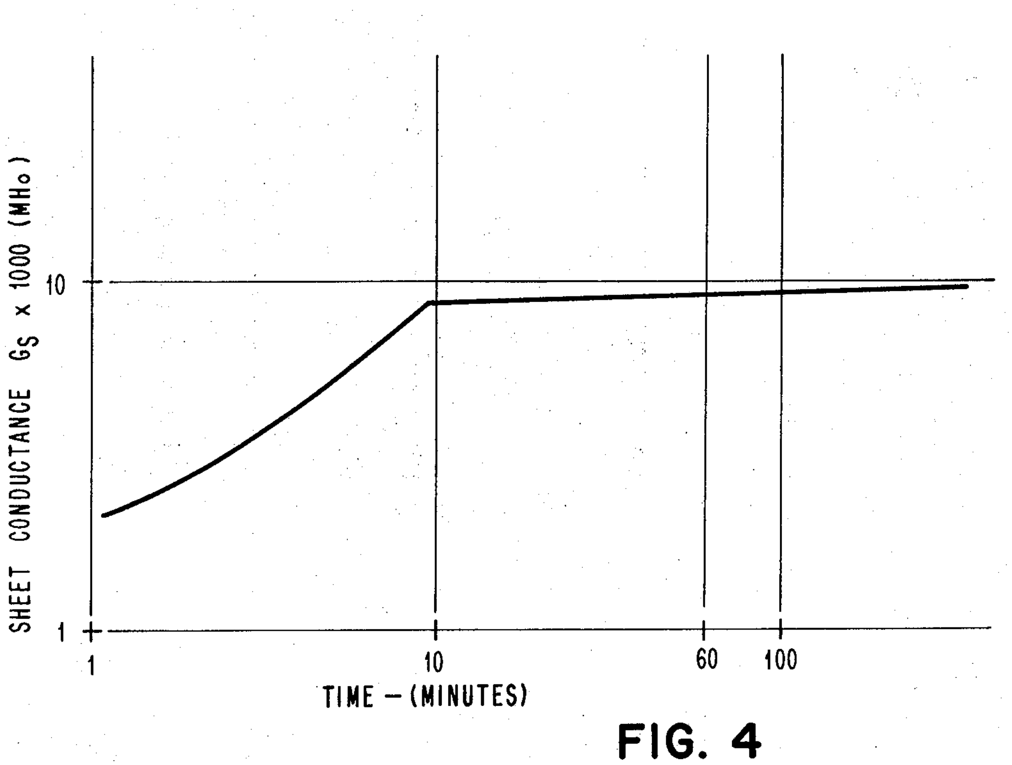
FIG. 4 is a graphic representation of sheet conductance ($G_s \times 1000$ (MHo)) of semiconductor silicon wafer substrates boron tribromide ($BBr_3$) diffused or doped versus time of feed of dopant and water into the hot zone of the diffusion tube.

It is apparent from the graphic representations in FIGS. 2, 3 and 4 that surface concentration ($C_o$) of dopant in the silicon wafer substrate is readily controllable in the disclosed method by coordinating time and flow rates. Electrical properties of the doped wafers are controlled as illustrated by FIG. 4 wherein sheet resistivity is predictable through time and dopant feed regulation.

While this invention has been particularly described with reference to the preferred embodiments thereof, it will be understood by those skilled in the art that the foregoing and other changes in form and detail may be made therein without departing from the spirit and scope of the invention.

We claim:

1. A method for diffusing a boron or phosphorus conductivity type dopant in a silicon semiconductor substrate comprising:

a. heating said silicon semiconductor substrate to a temperature between 900°C and 1200°C at atmospheric pressure, and b. separately introducing a conductivity type dopant selected from the group consisting of boron tribromide and phosphorus oxytrichloride and water in close proximity to said heated substrate for a specified time, and c. cooling to room temperature.

2. A method for diffusing a boron or phosphorus conductivity type dopant in a silicon semiconductor substrate comprising a. heating said silicon semiconductor substrate to a temperature between 950°C and 1050°C at atmospheric pressure, and b. separately introducing a 1:50 ratio by weight of a conductivity type dopant selected from the group consisting of boron tribromide and phosphorus oxytrichloride and water in close proximity to said heated substrate for a period between 50 and 130 minutes, and c. cooling to room temperature.

* * * * *